United States Patent
Chang et al.

(10) Patent No.: US 9,999,142 B1
(45) Date of Patent: Jun. 12, 2018

(54) HOUSING STRUCTURE OF ELECTRONIC DEVICE AND MANUFACTURING METHOD THEREOF

(71) Applicant: Acer Incorporated, New Taipei (TW)

(72) Inventors: Yi-Mu Chang, New Taipei (TW); Ching-Piao Kuan, New Taipei (TW); Wen-Chieh Tai, New Taipei (TW); Cheng-Nan Ling, New Taipei (TW)

(73) Assignee: Acer Incorporated, New Taipei (TW)

( * ) Notice: Subject to any disclaimer, the term of this patent is extended or adjusted under 35 U.S.C. 154(b) by 0 days. days.

(21) Appl. No.: 15/679,143

(22) Filed: Aug. 16, 2017

(30) Foreign Application Priority Data

Mar. 21, 2017 (TW) .............................. 106109356 A

(51) Int. Cl.
*H05K 5/00* (2006.01)
*H05K 5/03* (2006.01)
*H05K 5/04* (2006.01)

(52) U.S. Cl.
CPC ............. *H05K 5/0004* (2013.01); *H05K 5/03* (2013.01); *H05K 5/04* (2013.01)

(58) Field of Classification Search
CPC .......... H05K 5/0004; H05K 5/03; H05K 5/04; H05K 5/02; H05K 5/00; H05K 5/0217; H05K 5/0247; H05K 5/06; H05K 5/061; H02G 3/08; H02G 3/081; H02G 3/088; H01R 13/46; H01R 13/52; H01R 13/502
USPC ...... 174/520, 50, 17 R, 50.5, 535, 539, 559, 174/560; 220/3.2–3.9, 4.02; 361/600, 361/601, 641, 679.1, 709
See application file for complete search history.

(56) References Cited

U.S. PATENT DOCUMENTS

| | | | | |
|---|---|---|---|---|
| 7,947,900 B2 * | 5/2011 | Cheng | ..................... | H05K 5/04 174/50 |
| 8,053,668 B2 * | 11/2011 | Lai | ...................... | H05K 9/0009 174/50 |
| 8,124,890 B2 * | 2/2012 | Morimoto | ............. | H04M 1/026 174/541 |
| 8,609,985 B2 * | 12/2013 | Chen | ..................... | G06F 1/1656 174/50 |
| 8,816,217 B2 * | 8/2014 | Zheng | .................... | B32B 27/08 174/258 |
| 8,859,896 B2 * | 10/2014 | Chou | ...................... | H05K 5/02 174/50 |

FOREIGN PATENT DOCUMENTS

| CN | 104994189 | 10/2015 |
|---|---|---|
| TW | 201702043 | 1/2017 |

* cited by examiner

*Primary Examiner* — Angel R Estrada
(74) *Attorney, Agent, or Firm* — JCIPRNET

(57) ABSTRACT

A housing structure of an electronic device including a housing, a silicone rubber, and an assembling member is provided. The housing is metal and has an inner surface and an outer surface. The silicone rubber is disposed on the outer surface, and an edge of the silicone rubber is extended to the inner surface. The assembling member is disposed at the inner surface, such that the edge of the silicone rubber is clamped between the inner surface and the assembling member. A manufacturing method of the housing structure is also provided.

19 Claims, 5 Drawing Sheets

HOUSING STRUCTURE OF ELECTRONIC DEVICE AND MANUFACTURING METHOD THEREOF

CROSS-REFERENCE TO RELATED APPLICATION

This application claims the priority benefit of Taiwan application serial no. 106109356, filed on Mar. 21, 2017. The entirety of the above-mentioned patent application is hereby incorporated by reference herein and made a part of this specification.

BACKGROUND OF THE INVENTION

1. Field of the Invention

The invention relates to a housing structure and a manufacturing method thereof, and particularly relates to a housing structure of an electronic device and a manufacturing method thereof.

2. Description of Related Art

The design of the appearance of an electronic device has become one of the reasons when the consumers choose a product. Therefore, the designers and manufacturers constantly release electronic devices with different designs or appearances to try to draw the consumers' attention. In some of the designs, glass is even adopted as the material of the housing of the electronic device, so as to bring forth a transparent visual effect with a desirable appearance.

However, taking laptop computers as an example, in the current design trend of electronic devices pursuing a design that is small, thin, and light-weighted, even though glass is aesthetically suitable, the weight and the manufacturing cost of glass makes it difficult for a housing made of glass to compete with a housing made of metal or plastic materials because of the material properties of glass. Thus, while glass is aesthetically satisfying, it is still challenging to choose glass in the actual design.

SUMMARY OF THE INVENTION

The invention provides a housing structure of an electronic device and a manufacturing method thereof creating a visual effect simulating glass by disposing a silicone rubber on a housing including a metal material.

A housing structure of an electronic device according to an embodiment of the invention includes a housing, a silicone rubber, and an assembling member. The housing has an inner surface and an outer surface, and a material of the housing includes metal. The silicone rubber is disposed on the outer surface, and an edge of the silicone rubber is extended to the inner surface. The assembling member is disposed at the inner surface, such that the edge of the silicone rubber is clamped between the inner surface and the assembling member.

An embodiment of the invention provides a manufacturing structure of a housing structure including: forming a metal housing by impact molding, wherein the metal housing has an inner surface and an outer surface; attaching a silicone rubber to the outer surface by vacuum suction, and folding an edge of the silicone rubber to the inner surface; and disposing a plastic assembling member to the inner surface, such that the edge of the silicone rubber is clamped between the inner surface and the plastic assembling member.

Based on the above, the silicone rubber is disposed on the outer surface of the metal housing, the edge of the silicone rubber is arranged to extend and be folded to the inner surface of the metal housing, the plastic assembling member is disposed at the inner surface of the metal housing to clamp the silicone rubber between the plastic assembling member and the inner surface, and a portion of the silicone rubber located at the outer surface are pulled and stretched. Accordingly, by combining the silicone rubber and the metal housing, the housing structure of the electronic device is able to simulate an effect of glass. Hence, the aesthetics of the metal housing becomes more desirable with a transparent visual effect rendered by the silicone rubber.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
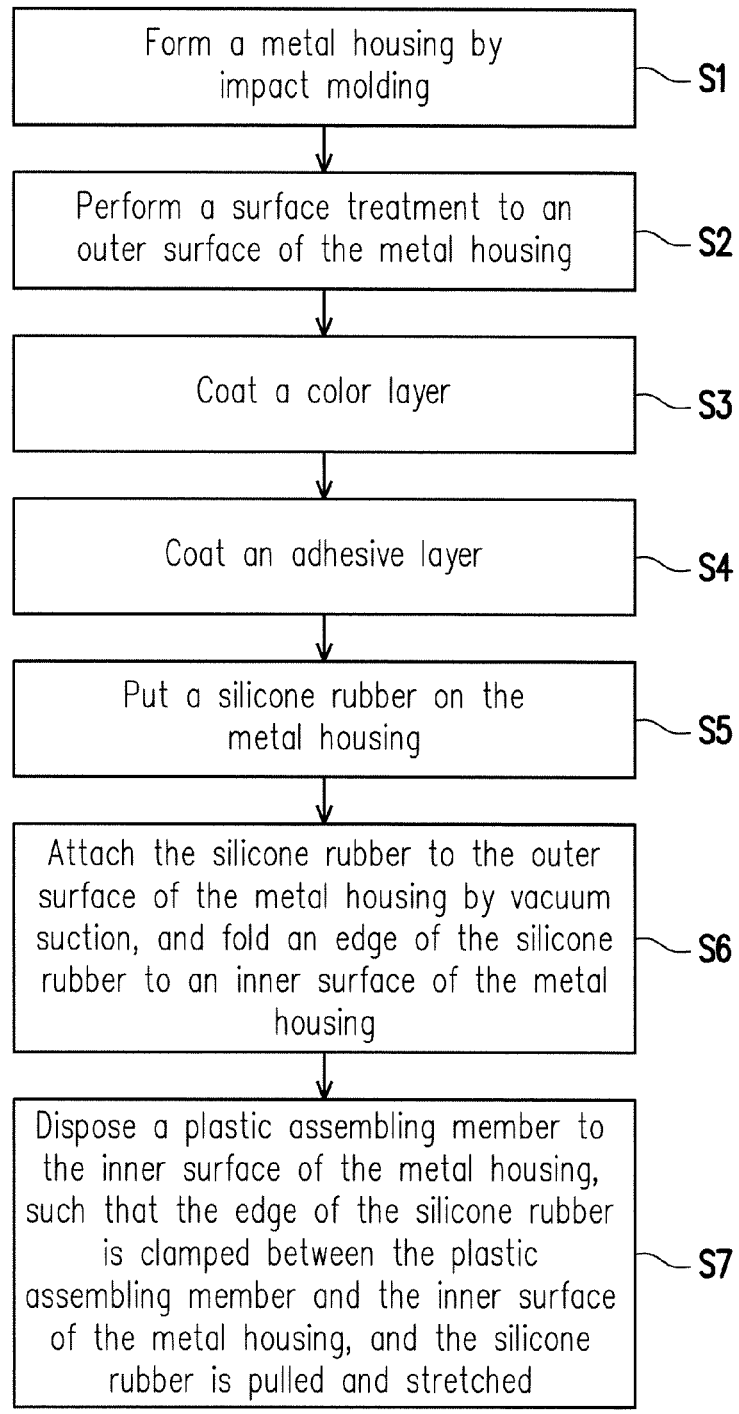
FIG. 1 is a flowchart illustrating a manufacturing process of a housing structure according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a flowchart illustrating a manufacturing process of a housing structure according to an embodiment of the invention. FIGS. 2 to 5 are schematic views illustrating structures corresponding to the flowchart of FIG. 1. Referring to FIG. 1 together with FIGS. 2 to 5, in the embodiment, an electronic device is a laptop computer, for example, and the housing structure refers to a back cover of a display visually occupying a majority of an overall appearance of the electronic device. However, the housing structure of the invention is not limited thereto. In other words, the housing structure is also applicable in other well-known electronic devices such as a mobile phone or a tablet computer.

Figure 2:
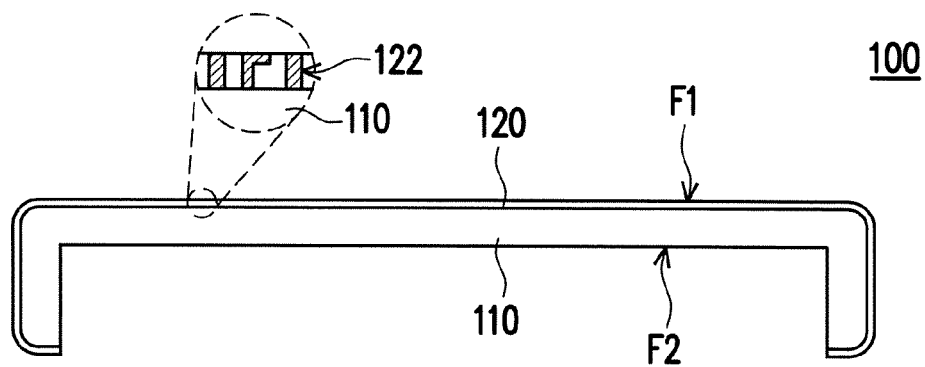
FIGS. 2 to 5 are schematic views illustrating structures corresponding to the flowchart of FIG. 1.

The housing structure of embodiment renders a visual effect simulating glass by adopting a metal housing and a silicone rubber. First of all, as shown in FIGS. 1 and 2, at Step S1, a metal housing 100 is formed by impact molding. In addition, the metal housing 100 includes an outer surface F1 and an inner surface F2. Then, at Step S2, a surface treatment is performed to the outer surface F1 of the metal housing 100 to form a treatment layer 120. The surface treatment may include an etching process. Namely, a microstructure is formed by eroding the outer surface F1. The embodiment is described herein using etching as an example. Therefore, in the metal housing 100, a base layer 110 that is not eroded and a pattern layer 122 located at the outer surface F1 are formed. In addition, the pattern layer 122 is at least a portion of the microstructure of the treatment layer 120. In other words, in the metal housing 100 of the embodiment, a portion with the treatment layer 120 is considered to be the outer surface F1, whereas a portion without the treatment layer 120 is considered to be the inner surface F2.

Figure 3:
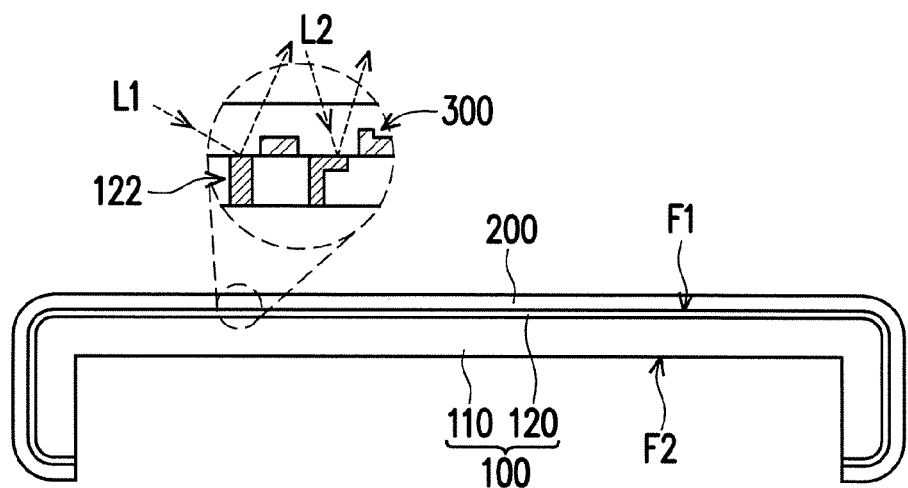

Then, referring to FIGS. 1 and 3, at Step S3, a color layer 300 is coated on the outer surface F1 of the metal housing 100. Also, at Step S4, an adhesive layer 200 is coated on the outer surface F1 of the metal housing 100. In the embodiment, the outer surface F1 is painted to form the color layer 300, and then the adhesive layer 200 is coated. Thus, the adhesive layer 200 covers the color layer 300. However, the invention is not limited thereto. The user may skip Step S3, reverse the order of Steps S3 and S4, or mix the paint and the adhesive to achieve an effect as desired through a single coating process. Moreover, the pattern layer 122 formed by the microstructure may render a colored visual effect due to changes of paths of light beams L1 and L2. Besides, the microstructure formed on the metal housing 100 allows the outer surface F1 to exhibit a higher degree of roughness to reinforce a bonding strength between the adhesive layer 200 or the color layer 300 and the metal housing. In the embodiment, the adhesive layer 200 is a transparent primer, for example, to bind the metal and silicone rubber.

Figure 4A:
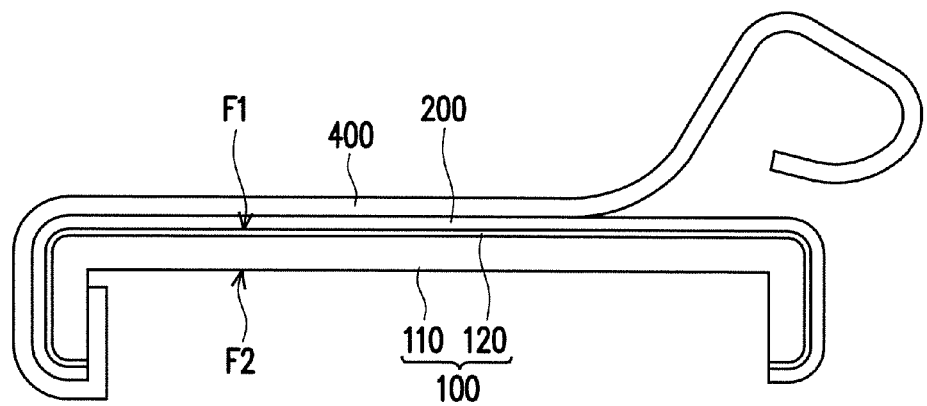
Figure 4B:
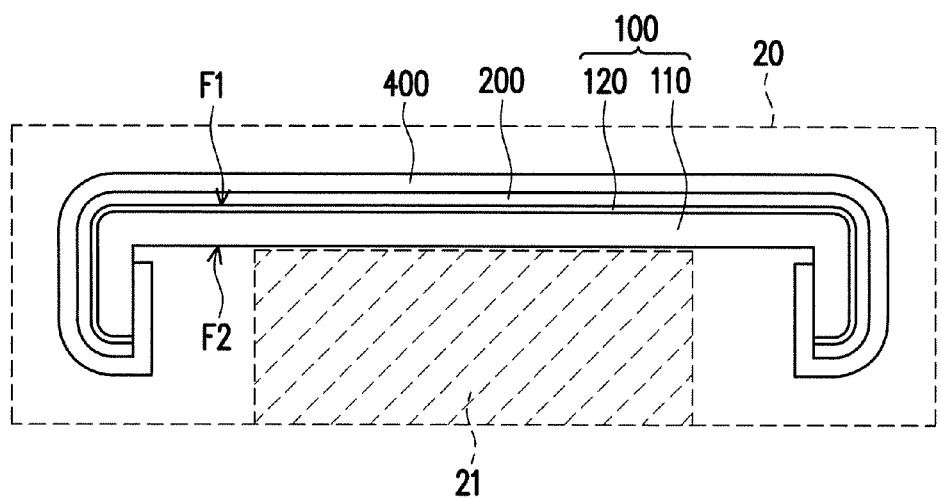

Then, referring to FIG. 1 together with FIGS. 4A and 4B, at Step S5, a silicone rubber 400 is provided. The silicone rubber 400 may be formed as a three-dimensional object by injection or pressing. In addition, since the silicone rubber 400 is flexible, the silicone rubber 400 may be put on the metal housing 100. Then at Step S6, the silicone rubber 400 is attached to the outer surface F1 of the metal housing 100 through the adhesive layer 200 by vacuum suction, so as to cover the adhesive layer 200, the color layer 300, and the pattern layer 122.

As shown in FIG. 4A, the silicone rubber 400 is a three-dimensional object. Namely, a three-dimensional object (i.e., the silicone rubber 400) consistent with a profile of the outer surface F1 of the metal housing 100 is formed, and then the silicone rubber 400 is put on the outer surface F1 of the metal housing 100. Since conventional glass or related materials are limited by properties of being hard and brittle and are much less flexible than the silicone rubber 400, adopting silicone rubber 400 may facilitate a manufacturing efficiency and reduce a material loss in the manufacturing of the housing structure.

It should be noted that, at Step S5, after the silicone rubber 400 is put on the metal housing 100, an edge of the silicone rubber 400 needs to further extend from the outer surface F1 to the inner surface F2 and be folded to the inner surface F2. Besides, at Step S6, the metal housing 100 as well as the silicone rubber 400 on the metal housing 100 are placed into a vacuum chamber 20 together and disposed on a jig 21 for a vacuum treatment. During the process, air between the metal housing 100 and the silicone rubber 400 remaining during the put-on process may be discharged through vacuum suction. Hence, a bonding strength between the silicone rubber 400 and the metal housing through the adhesive layer 200 is facilitated.

Figure 5:
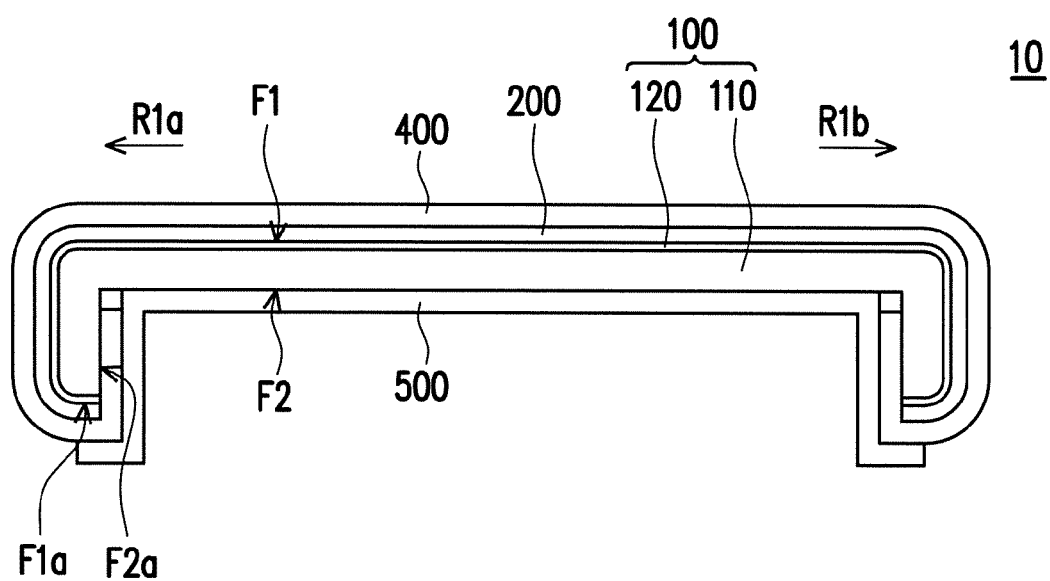

Lastly, referring to FIG. 1 and FIG. 5, at Step S7, a plastic assembling member 500 is disposed at the inner surface F2 of the metal housing 100. Accordingly, the edge of the silicone rubber 400 is clamped between the plastic assembling member 500 and the inner surface F2 of the metal housing 100. Meanwhile, as shown in FIG. 5, there are substantially a plurality of parts where the plastic assembling member 500 and the metal housing 100 are combined. Thus, a portion of the silicone rubber 400 on the outer surface F1 is pulled and stretched by a plurality of pulling forces R1*a* and R1*b*.

In the embodiment, the plastic assembling member 500 is combined with the inner surface F2 of the metal housing 100 by (in-mold) injection molding. In another embodiment, the manufacturer may also attach the plastic assembling member 50 to the inner surface F2 by adhesion. In the embodiment, the plastic assembling member 500 is a structural member for configuring and assembling a display in a laptop computer, for example.

Accordingly, the housing structure 10 is manufactured.

Based on the above, the silicone rubber 400 is disposed on the outer surface F1 of the metal housing 100. In addition, the silicone rubber 400 is transparent and has a thickness in the range from 0.3 mm to 1 mm. Thus, in addition to avoiding damages during injection molding due to an overly thin thickness, the silicone rubber 400 may also allow light to pass through and generate light refraction after being combined with the metal housing 100. Thus, a pattern (i.e., the pattern layer 122 and/or the color layer 200) of the metal housing 100 on the outer surface F1 is able to render a different visual effect owing to optical properties of the silicone rubber 400. Hence, the housing structure 10 according to the embodiment is capable of exhibiting a visual effect same as the visual effect of other housing structures adopting glass, thereby simulating the effect of glass. In addition, the housing structure of the embodiment is free from limitations on material properties and manufacturing cost that arise when glass is adopted.

In other embodiments not shown herein, other materials may be added to the silicone rubber to provide light transparency (e.g., light transmission rates and refraction rates) in different degrees or to scatter light, thereby diversifying the visual effect. In addition, various surface treatments (e.g., sandblasting, brushing, etc.) with different effects performed to the metal housing 100 may be used together with the silicone rubber with different degrees of light transparency to render different visual effects.

Figure 6:
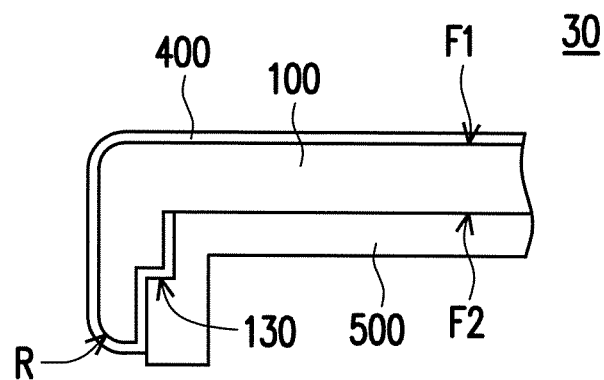
FIGS. 6 and 7 are respectively schematic views illustrating housing structures according to different embodiments of the invention.
Figure 7:
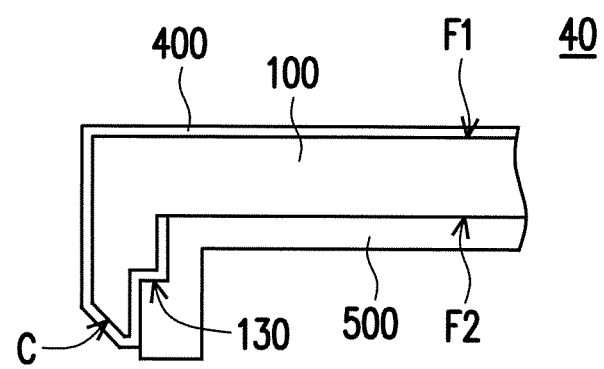

Referring to FIG. 5 again, in the embodiment, the plastic assembling member 500 substantially abuts against a bending part on an inner side of the metal housing 100. In other words, the plastic assembling member 500 is disposed across a portion F2*a* of the inner surface F2 and a portion F1*a* of the outer surface F1 to reinforce the bonding strength between the metal housing 100 and the plastic assembling member 500 and thus stabilize the edge of the silicone rubber 400. However, the invention does not intend to limit how the plastic assembling member and the metal housing are combined. FIGS. 6 and 7 are respectively schematic views illustrating housing structures according to different embodiments of the invention. Referring to FIG. 6, in the embodiment, a rounded corner R is provided at where the inner surface F2 and the outer surface F1 in the housing 100 of a housing structure 30 are connected (i.e., where the outer surface F1 is adjacent to the inner surface F2). Therefore, a stage structure (or a turn structure) 130 between the plastic assembling member 500 and the inner surface F2 is required to fit the plastic assembling member 500 and the inner surface F2 to each other. Referring to FIG. 7, similarly, a cut corner C is provided at where the inner surface F2 and the outer surface F1 in the metal housing 100 of the embodiment are connected (i.e., where the outer surface F1 is adjacent to the inner surface F2). Therefore, the stage structure (or turn structure) 130 between the plastic assembling member 500 and the inner surface F2 is also required to fit the plastic assembling member 500 and the inner surface F2 to each other.

In other words, in the embodiment shown in FIG. 5, when the stage structure is not provided at the inner surface F2 of the plastic assembling member 500, the plastic assembling member 500 needs to be disposed across the inner surface F2 and the outer surface F1 to be combined with the metal housing 100. However, in the embodiments shown in FIGS. 6 and 7, with the stage structure disposed at the inner surface F2, the plastic assembling member 500 only needs to abut against the inner surface F2 for combination. In any of the embodiments in FIGS. 5 to 7, the user may suitably adopt a corresponding solution based on the size and a requirement on spatial arrangement of the metal housing 100.

In view of the foregoing, according to the embodiments of the invention, the silicone rubber is disposed on the outer surface of the metal housing, the edge of the silicone rubber is arranged to extend and be folded to the inner surface of the metal housing, the plastic assembling member is disposed at the inner surface of the metal housing to clamp the silicone rubber between the plastic assembling member and the inner surface, and a portion of the silicone rubber located at the outer surface are pulled and stretched. Accordingly, by combining the silicone rubber and the metal housing, the housing structure of the electronic device is able to simulate an effect of glass. Hence, the aesthetics of the metal housing becomes more desirable with a transparent visual effect rendered by the silicone rubber.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A housing structure of an electronic device, comprising:
    a housing, having an inner surface and an outer surface, wherein a material of the housing comprises metal;
    a silicone rubber, disposed on the outer surface, wherein an edge of the silicone rubber extends to the inner surface; and
    an assembling member, disposed at the inner surface, and the edge of the silicone rubber clamped between the inner surface and the assembling member.

2. The housing structure as claimed in claim 1, wherein a material of the assembling member comprises plastic.

3. The housing structure as claimed in claim 1, wherein the silicone rubber is transparent.

4. The housing structure as claimed in claim 1, wherein a thickness of the silicone rubber is ranged from 0.3 mm to 1 mm.

5. The housing structure as claimed in claim 1, further comprising an adhesive layer disposed between the silicone rubber and the outer surface.

6. The housing structure as claimed in claim 1, further comprising a pattern layer or a color layer disposed between the silicone rubber and the outer surface.

7. The housing structure as claimed in claim 1, wherein a microstructure is formed at the outer surface of the housing to form a pattern layer or a color layer.

8. The housing structure as claimed in claim 1, wherein the inner surface and the assembling member are fit to each other by a stage structure.

9. The housing structure as claimed in claim 1, wherein a rounded corner or a cut corner is provided at where the inner surface and the outer surface of the housing are connected.

10. The housing structure as claimed in claim 1, wherein the silicone rubber is a three-dimensional object consistent with a profile of the outer surface of the housing.

11. A manufacturing method of a housing structure configured for manufacturing a housing structure of an electronic device, wherein the manufacturing method comprises:
    forming a metal housing by impact molding, wherein the metal housing has an inner surface and an outer surface;
    attaching a silicone rubber to the outer surface by vacuum suction, and folding an edge of the silicone rubber to the inner surface; and
    disposing a plastic assembling member to the inner surface, such that the edge of the silicone rubber is clamped between the inner surface and the plastic assembling member.

12. The manufacturing method of the housing structure as claimed in claim 11, further comprising:
    performing a surface treatment to the outer surface before attaching the silicone rubber to the outer surface by vacuum suction.

13. The manufacturing method of the housing structure as claimed in claim 12, wherein the surface treatment comprises eroding the outer surface to form a microstructure.

14. The manufacturing method of the housing structure as claimed in claim 12, further comprising:
    coating an adhesive layer on the outer surface after performing the surface treatment, wherein the silicone rubber is attached to the outer surface through the adhesive layer.

15. The manufacturing method of the housing structure as claimed in claim 12, wherein the surface treatment comprises forming a microstructure on the outer surface to form a pattern layer or a color layer.

16. The manufacturing method of the housing structure as claimed in claim 12, further comprising:
    coating a color layer on the outer surface after performing the surface treatment.

17. The manufacturing method of the housing structure as claimed in claim 11, wherein disposing the plastic assembling member at the inner surface comprises:
    forming the plastic assembling member at the inner surface by injection molding.

18. The manufacturing method of the housing structure as claimed in claim 11, wherein disposing the plastic assembling member at the inner surface comprises:
    disposing the plastic assembling member at the inner surface by adhesion.

19. The manufacturing method of the housing structure as claimed in claim 11, wherein a stage structure or a turn structure is provided between the plastic assembling member and the housing.

* * * * *